United States Patent [19]

Ito et al.

[11] Patent Number: 4,826,943

[45] Date of Patent: May 2, 1989

[54] NEGATIVE RESIST MATERIAL

[75] Inventors: Toshio Ito; Miwa Sakata; Yoshio Yamashima, all of Tokyo, Japan

[73] Assignee: Oki Electric Industry Co., Ltd., Tokyo, Japan

[21] Appl. No.: 78,268

[22] Filed: Jul. 27, 1987

[30] Foreign Application Priority Data

Jul. 25, 1986 [JP] Japan .................. 61-175419
Feb. 27, 1987 [JP] Japan .................. 62-43112

[51] Int. Cl.$^4$ ............................. C08G 77/06
[52] U.S. Cl. ........................ 528/21; 528/32; 528/42; 556/450; 556/466
[58] Field of Search ............ 528/32, 42, 21; 556/450, 466

[56] References Cited

U.S. PATENT DOCUMENTS 4,481,049 11/1984 Reichmanis et al. .
4,564,576 1/1986 Saigo et al. .
4,702,990 10/1987 Tanaka et al. .............. 430/285

FOREIGN PATENT DOCUMENTS 0076656 9/1982 European Pat. Off. .
0163538 5/1985 European Pat. Off. .
1049102 1/1955 Fed. Rep. of Germany .
WO85/05470 12/1985 PCT Int'l Appl. .

OTHER PUBLICATIONS

Journal of the Electrochemical Soc., Sep. 1983, pp. 1962–1964, "Copolymers of Trimethylsilyl Styrene with Chloromethyl Styrene for a Bi-Layer Resist System", M. Suzuki et al.

M. Suzuki et al., "Copolymers of Trimethylsilylstyrene with Chloromethylstyrene for a Bi-Layer Resist System," J. Electrochem. Soc., pp. 1962–1964, 9/83.

6001 Chemical Abstracts, vol. 96, (1983, May, No. 18, Columbus, Ohio, vol. 9, No. 239, (p. 391), (1962), Sep. 25, 1985, "Resist Material".

"Syntheses de polysiloxanes organofonctionnels, 2, Les poly[(halomethylmethyl)siloxane]s et leurs modeles"; Makromol. Chem., 184, pp. 1179–1187, (1983).

Primary Examiner—Melvyn I. Marquis
Attorney, Agent, or Firm—Wenderoth, Lind & Ponack

[57] ABSTRACT

A negative resist material consists of poly (silsesquioxane) of weight average molecular weight 2000 or more represented by the general formula (1):

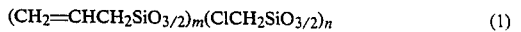

$$(CH_2=CHCH_2SiO_{3/2})_m(ClCH_2SiO_{3/2})_n \qquad (1)$$

where m and n denote the molar percentages of each component of the polymer, and $m+n=100$. A method of producing such a resist material and a method of forming a bi-layer resist pattern using the resist material are also disclosed.

12 Claims, 3 Drawing Sheets

FIG. IA
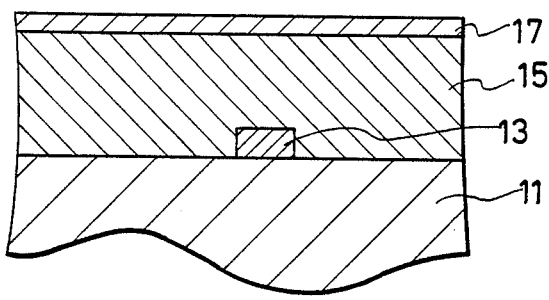
FIG. IB
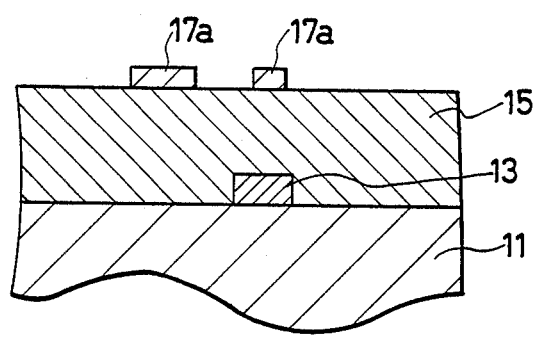
FIG. IC
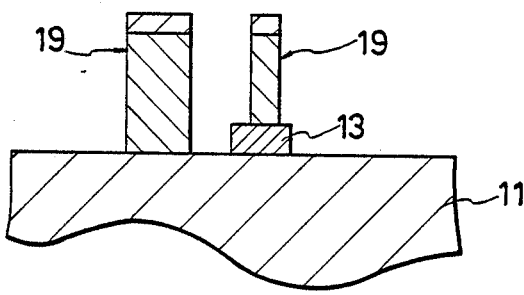

NEGATIVE RESIST MATERIAL

BACKGROUND OF THE INVENTION

This invention concerns a negative resist material used for manufacturing active elements, metallization patterns and the like involved in constructing semiconductor devices, a method of manufacturing such a negative resist material, and a method for forming resist patterns using this negative resist material.

In recent years, due to the higher degree of integration in semiconductor devices, a technique has come to be required in the manufacturing process which is capable of forming a fine resist pattern with a high aspect ratio (ratio of height of pattern/width of pattern). When carrying out multi-layer metallization, however, steps occur between the metallization formed on the substrate and the substrate surface, and these steps interfere when it is desired to form a new resist pattern for the next metallization.

In order to form a resist pattern on such a substrate with a high degree of dimensional precision, it is desirable to form a resist layer of sufficient thickness to cover these steps, thereby planarizing the surface following which the planarized surface can be exposed to electron beam or the like. By direct irradiation, however, it is extremely difficult in practice to form a pattern of the order of several submicrons in thickness on a film which may be as thick as, for example, 2 $\mu$m. This is particularly due to the fact that, although the number of back-scattered electrons can be reduced by making the film thicker, forward scattering or scattering of incident electrons within the film becomes more marked for thicker films.

To overcome the above disadvantages, a bi-layer resist process has been proposed by which a fine resist pattern with a high aspect ratio can be obtained even from a resist film of considerable thickness.

This bi-layer resist process will be briefly explained with reference to FIGS. 1A to 1C. These drawings show part of the wafer in sectional outline.

In the bi-layer resist process, a resist pattern is obtained by using a lower resist layer 15 consisting of a thick film to absorb step 13 on substrate 11 thereby planarizing the surface, and an upper resist layer 17 containing silicon which is formed on lower layer 15 (see FIG. 1A). This upper layer 17 normally has a film thickness of about 0.15–0.3 $\mu$m, and is patterned by exposure to light or an electron beam, or other suitable means to obtain a resist pattern 17a (see FIG. 1B). The lower layer 15 is removed by $O_2$—RIE (Reactive Ion Etching) during which the resist pattern 17a is then used as an etching mask. In this way, the upper layer resist pattern 17a can be transferred to the lower layer 15, and a fine bi-layer resist pattern 19 with a high aspect ratio can thus be obtained (see FIG. 1C). Electron beam lithography using a bi-layer resist process can effectively reduce both the back scattering and forward scattering mentioned above.

Different resists have been proposed for this bi-layer process, and those used as the upper layer will now be described. As the upper layer must have resistance to $O_2$—RIE, various materials containing silicon were developed, for example that which is disclosed in "Journal of the Electrochemical Society, 130 [9], p. 1962 (1983)). The material proposed in this reference is a copolymer of trimethylsilylstyrene (denoted by SiSt) as a silicon-containing photoresist, and chloromethylstyrene (denoted by CMS), in a copolymerization ratio of 90:10. It is reported that the copolymer P (SiSt$_{90}$—CMS$_{10}$) has both excellent $O_2$—RIE resistance and sensitivity to electron beams. According to this report, when P (SiSt$_{90}$—CMS$_{10}$) is subjected to $O_2$—RIE, the amount of etching (which may hereafter be also refer to as the initial etching amount), which takes place until the decrease in film thickness shows the very small value of several Å/min, is 220–290 Å. Further, the sensitivity to electron beams (radiationdose at which gelation being, D$_G{}^i$.) is stated to be 2.1 $\mu$C/cm$^2$.

It is also stated that when P (siSt$_{90}$—CMS$_{10}$) was used, a resist pattern of submicron order with thickness 1.6 $\mu$m was formed when the dose was 4.5 $\mu$C/cm$^2$.

Conventional photoresists of the type described above present a problem in that, because the initial etching amount is as high as 220°–290 Å, they do not permit much uch process latitude. More specifically, since the initial etching amount is so high when this resist is used as an etching mask, the resist film has to be deposited fairly thickly. If on the other hand the upper resist layer is too thick, it is no longer possible to obtain a fine resist pattern with a high aspect ratio. There is therefore a limit to the thickness of the upper layer, and for this reason, the lower resist layer also cannot be made too thick.

Another problem with conventional resists is that the actual dose required for formation of submicron pattern is 4.5 $\mu$C/m$^2$, which is high (meaning low sensitivity). Considering the fact that throughput with electron beam exposure is lower than with light exposure, a resist of higher sensitivity is required.

Many linear (or straight-chain) siloxanes consisting of silicone resins become insoluble in solvents when they are irradiated by an electron beam and, as they are also resistant to reactive ion etching with oxygen ($O_2$—RIE), various applications in bi-layer electron beam resists have been proposed. In cases where the molecular weight is not sufficiently high, however, many of these siloxanes approach the liquid state, so that their use as resists involves problems.

In this connection it is thought that "ladder" type siloxane resins, which are trifunctional silane polymers, may provide an answer to most of these problems on account of their special structure, wherein the two siloxane chains are fixed through an oxygen atom. Ladder structure siloxane resins are usually manufactured by polymerizing lower polymers obtained by the hydrolysis of trifunctional silane monomers with three functional groups, in the presence of an alkali catalyst, so as to give polymers of higher molecular weight.

It is, for example, widely known that phenyl trichlorosilane, which is one of the trifunctional silane monomers mentioned above, can be hydrolysed to give a oligomer, from which high molecular weight benzene-soluble poly(phenylsilsesquioxane) can be obtained by heating in benzene in the presence of trace amounts of KOH as catalyst (J. Amer. Chem. Soc., Vol. 82, 1960, p. 6194–6195).

Silicone resin homopolymers or copolymers, where the substituent attached to silicon is allyl or chloromethyl, have properties of coatability and electron beam sensitivity which make them eminently suitable as bi-layer electron beam resists of the type the inventors have been considering. If the above method is applied to their synthesis, however, a gel is formed if the polymerization temperature is higher than 150° C., and it is difficult to obtain a polymer which is soluble in solvents. Further, even if the polymerization is carried out at a lower temperature, part is still converted to gel with the result that most of the siloxane extracted by solvent consists of lower molecular weight polymers.

SUMMARY OF THE INVENTION

An object of the invention is to provide a negative resist material with $O_2$—RIE resistance, and excellent sensitivity to electron beams and other high energy beams.

Another object of the invention is to provide a method capable of forming fine resist patterns with a high aspect ratio and with high throughput.

A further object of the invention is to provide a method of obtaining a solvent-soluble silicone resin under mild reaction conditions, eliminating the problem of gel formation in the polymerization reaction.

A negative resist material according to one aspect of the invention consists of poly(silsesquioxane) of weight average molecular weight not less than 2000, preferably not less than 2500, more preferably 3000 to 100,000 represented by the general formula (1) below:

$$(CH_2=CHCH_2SiO_{3/2})_m (ClCH_2SiO_{3/2})_n \quad (1)$$

where m and n denote the molar percentage of each component of the polymer, and $m+n=100$.

The poly(silsesquioxane) represented by formula (1) is a polymer of silsesquioxane. It may be prepared for example by hydrolysing a mixture of allyl trichlorosilane and chloromethyltrichlorosilane in a mixed solvent consisting of methyl isobutyl ketone and tetrahydrofuran, and polymerizing the resultant low copolymer at room temperature in the presence of, for example, triethylamine. The product is a colorless solid.

The negative resist material of this invention is a poly(silsesquioxane) wherein the molecule contains allyl and chloromethyl substituent groups. Allyl groups have a high tendency to polymerize, and if large numbers of them are included, the sensitivity of the negative resist to electron beams and X-rays is increased. Chloromethyl groups affect the contrast of the negative resist, and if large numbers of them are included, the contrast of the resist is heightened.

The molecules of the negative resist of this invention contain a substantial amount of silicon, and from the viewpoint of composition, there are 3/2 oxygen atoms for each silicon atom. As this is close to the composition of silicon dioxide, it may be expected that the $O_2$—RIE resistance of this resist material will also approach that of silicon dioxide.

Further, this resist material dissolves in ketones such as methyl isobutyl ketone and methyl ethyl ketone, or aromatic solvents such as xylene and chlorobenzene, and a resist solution for forming a resist pattern can therefore be easily obtained.

A method for a bi-layer resist pattern according to a second aspect of the invention comprises the steps of: forming a lower layer resist on a foundation, forming an upper layer resist on this lower layer, selectively irradiating the upper layer with an energy beam, developing the irradiated upper layer so as to form an upper layer resist pattern, and selectively removing the lower layer in an oxygen plasma using the upper layer pattern acting as a mask, said upper layer being formed of poly(silsesquioxane) of weight average molecular weight not less than 2000, preferably not less than 2500, more preferably 3000 to 100,000 represented by the general formula (1) above.

Said energy beam, moreover, may conveniently be an electron beam or an X-ray beam.

According to a third aspect of the invention, low polymers are first obtained by the hydrolysis of the trifunctional silanes described below. The low polymers are then further polymerized in a ketonic solvent in the presence of a basic solvent such as an amine.

This method permits the manufacture of ladder type silicone resins, represented by the general formula below, where the substituent group on silicon is allyl or chloromethyl:

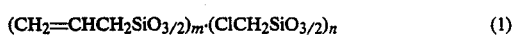

$$(CH_2=CHCH_2SiO_{3/2})_m \cdot (ClCH_2SiO_{3/2})_n \quad (1)$$

m and n being molar percentages.

More specifically, the silane monomers represented by formulae (2) and (3) below are hydrolyzed under acid conditions either alone or in admixture with one another in any molar fraction, and the resulting oligomer of molecular weight approx. 800 is then condensation polymerized in the presence of a basic catalyst. The final product is purified by precipitation:

$$CH_2=CHCH_2SiX_3 \quad (2)$$

$$ClCH_2SiY_3 \quad (3)$$

In the above formulae (2) and (3), X and Y are groups susceptible to hydrolysis, such as chlorine, methoxy, ethoxy or acetoxy.

The basic catalyst used in the above condensation polymerization should preferably be one in which the reaction can proceed in a homogeneous system, such as an amine. Inorganic bases such as alkali metal hydroxides are not soluble in the solvents used, and are therefore unsuitable. Typical bases such which are used include triethylamine, tri-n-butylamine, pyridine, lutidine or γ—collidin. The condensation polymerization can be carried out with or without a solvent. The use of a solvent is, however, much more preferable, due to the fact that the reaction conditions are easier to control (from the viewpoint of stirring or stopping the reaction), the yield of polymer is higher, the properties of the resist are improved, and operations are more reproducible. The solvent used may for example be tetrahydrofuran, dioxane, acetone, methyl ethyl ketone or methyl isobutyl ketone.

As will be clear from the preferred embodiments to be described, the silicone resins obtained in this invention can be manufactured easily by choosing arbitrary values for the molar percentages m and n in formula (1). The silicone resins also have all the properties required of resists, i.e. solvent solubility, coatability and electron beam sensitivity.

Their sensitivity to electron beams is particularly high. In many cases, for example, the sensitivity was 2 $\mu C/cm^2$ or higher (of a lower sensitivity) on the surface of the polymer film, which is a necessary condition for considerably reducing the backscattering.

When the resins of this invention are used to form patterns using an actual bi-layer electron beam resist, they have at least 30 times the resistance of conventional photoresists to the $O_2$—RIE mentioned above. This resistance is also more or less independent of compositional changes due to variation in the values of m and n, and they are, therefore, very suitable materials.

As described above, the method of forming negative resist material according to this invention involves the formation of a low polymer by hydrolysis of said trifunctional monomers, and the further polymerization of the low polymer in a ketonic solvent in the presence of a basic catalyst. Although the reason is not clear, this method conveniently avoids the gelation mentioned above. It also gives stable properties to the silicone resin product including solvent solubility, coatability, electron beam sensitivity and $O_2$—RIE resistance.

Now further consideration on the values m and n in the formulae (1) and (2) will be given below.

FIG. 3 shows variation in radiation dose ($\mu C/cm^2$) required for removing 50% of the initial thickness of the resist layer, before and after curing in vacuum for 2 hours. When m was 30 and 20 respectively, the dose required for removing 50% of the initial thickness of the resist layer is almost unchanged. When m was 50 and 80, respectively, the dose required for removing 50% of the initial thickness of the resist layer is lowered after 2 hours of curing. This means there was marked post polymerization when m was 50 and 80, respectively. Accordingly, it can be said that m should be not more than about 30 to substantially eliminate post polymerization.

BRIEF DESCRIPTION OF DRAWINGS

FIGS. 1A to 1C are diagrams illustrating the bi-layer resist manufacturing process.

DESCRIPTION OF THE PREFERRED EMBODIMENTS

Figure 2:
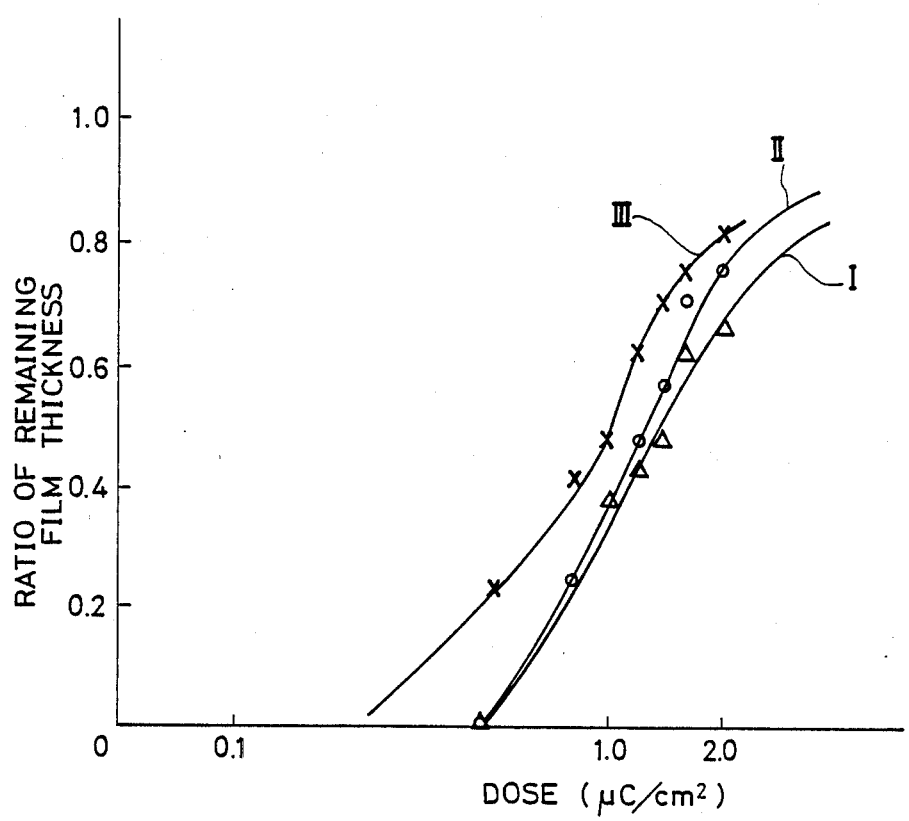
FIG. 2 is a characteristic diagram showing the sensitivity of the negative resists of this invention to an electron beam.
Figure 3:
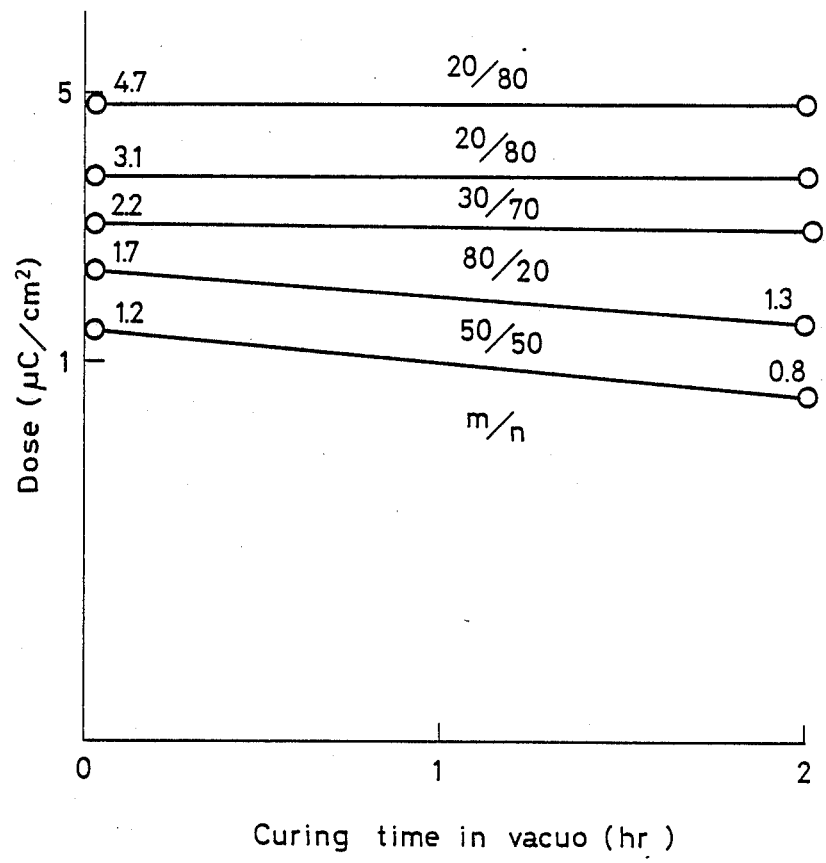
FIG. 3 is a diagram showing the effect of post-polymerization in relation to the value of m.

Preferred embodiments of the invention will now be described.

EXAMPLE 1-1

7.0 g (40 mmol) of allyl trichlorosilane (manufactured by Petrach Systems, further purified by distillation) was dissolved in a mixed solvent consisting of 37 ml of methyl isobutyl ketone (dried over molecular sieves, abbreviated hereafter as MIBK), and 13 ml of tetrahydrofuran (dried over molecular sieves, abbreviated hereafter as THF). The mixture was cooled to 0° C. with stirring, and 4.0 g (40 mmol) of triethylamine (dried over molecular sieve, abbreviated hereafter as $Et_3N$) was added dropwise over a period of 5 min. After stirring for 5 min, 6.3 g (350 mmol) of water was added dropwise into the solution over a period of 20 min. Stirring was continued for 1 hour, and the mixture was then heated. While maintaining the temperature of the reaction mixture at 80°–85° C., stirring was continued for a further 4 hours. The solution obtained was cooled to room temperature, and diluted with 200 ml of ethyl acetate. After removing the aqueous layer with a separating funnel, the organic layer was washed with water until the solution became neutral, then with brine. This organic layer was dried with anhydrous magnesium sulfate, and the solvent was distilled off under reduced pressure on a water bath at 50° C. or a lower temperature to give 3.6 g of an oily substance. The weight average molecular weight of this oily substance was 850, which was judged to be an oligomer of polymerization degree about 8–10.

To 3.0 g of the above oily substance, 3.0 g of MIBK was added at room temperature with stirring, then 0.3 g of $Et_3N$ was added and the mixture reacted for 15 min. After dilution with 4.0 g of MIBK, this was poured into 200 ml of methanol cooled in ice, and a white precipitate was obtained. This precipitate was filtered, washed twice with 50 ml of cold methanol, and dried under vacuum at room temperature to give 1.3 g of a resinous substance (Polymer (1)). The weight average molecular weight of this polymer ($\overline{MW}$) was 3,000. It was dissolved successfully by benzene, toluene, xylene, chlorobenzene, acetone, methyl ethyl ketone, MIBK, diisobutylketone, 2-methoxyethyl acetate, 2-ethoxyethyl acetate, cyclohexane, ethyl acetate, trichlene, chloroform, THF, dioxane dimethyl formamide and dimethyl sulfoxide.

EXAMPLE 1-2

7.0 g (40 mmol) of allyl trichlorosilane was dissolved in a mixed solvent consisting of 37 ml MIBK and 13 ml of THF, and the mixture was cooled to 0° C. with stirring. 4.0 g (40 mmol) of $Et_3N$ was then added dropwise over a period of 5 min. After stirring for 5 min, 1.1 g (60 mmol) of water was added dropwise into this solution over a period of 5 min, stirring was continued for 1 hour and the mixture heated. While maintaining the temperature of the reaction mixture at 80°–85° C., stirring was continued for a further 4 hours. The solution obtained was cooled to room temperature, 200 ml of ethyl acetate was added, and the aqueous layer was removed with a separating funnel. The organic layer was washed with water until neutral, and then washed with brine.

This organic layer was dried over anhydrous magnesium sulfate, and the solvent was distilled off under reduced pressure to give 3.6 g of an oily substance. The oily substance obtained was dissolved in 14.4 g of MIBK, 0.18 g of $Et_3N$ was added, then the mixture was heated to 80° C. and stirred for 2 hours. After cooling to room temperature, it was poured into 200 ml of cold methanol, and a white precipitate was obtained. This was washed twice with 50 ml of cold methanol, and dried under vacuum to give 2.4 g of resin ($\overline{MW}=11,000$: Polymer (2)).

EXAMPLE 1-3

A polymer was synthesized by exactly the same procedure as in Example 1-1, excepting the silicon compound starting materials were 5.6 g (32 mmol) of allyl trichlorosilane and 1.5 g (8 mmol) of chloromethyl trichlorosilane. The yield of the intermediate oligomer was 3.5 g. Starting from 3.0 g of prepolymer, the yield of product after condensation polymerization was 1.4 g ($\overline{MW}=8,500$, Polymer (3)).

EXAMPLES 1-1 TO 1-10

The results in Table 1 at the end of the Specification were obtained by the same procedure as in Example 1-1, excepting the ratios of allyl trichlorosilance and chloromethyl trichlorosilane in Example 1-3 above were as shown in the table, and were such that their total amount was 40 mmol. The amount of prepolymer used in the condensation polymerization was 3.0 g in all cases.

EXAMPLE 1-11

The procedure was the same as in Example 1-8, i.e. the ratio of allyl trichlorosilane and chloromethyl trichlorosilane was 20/80, but the condensation of the prepolymer was carried out in 9.0 g of MIBK. 1.1 g of resin (Polymer (11), $\overline{MW}=24{,}000$) was obtained.

EXAMPLE 1-12

The procedure was the same as in Example 1-8, excepting 0.3 g of pyridine was used as the basic catalyst and the condensation polymerization was carried out for 1 hour, 1.0 g of Polymer (12) ($\overline{MW}=39{,}000$) was obtained.

EXAMPLE 1-13

The procedure was the same as in Example 1-8, excepting 0.3 g of 4-dimethylaminopyridine was used as the basic catalyst and the condensation polymerization was carried out for 1 hour. 1.2 g of resin (polymer (13), $\overline{MW}=15{,}000$) was obtained.

EXAMPLE 1-14

1.3 g (8 mmol) of allyl trimethoxysilane (manufactured by Petrach Systems, and purified by distillation), and 6.8 g (32 mmol) of chloromethyl triethoxysilane (manufactured by Petrach Systems, and purified by distillation), were dissolved in a mixed solvent consisting of 37 ml MIBK and 13 ml THF. 4.0 g (40 mmol) of $Et_3N$ was added, and the mixture cooled to 0° C. with stirring. 10 ml (120 mmol) of 12N HCL was then dripped in over a period of 20 min. The mixture was stirred for 1 hour, heated, and stirring was continued at a temperature of 80°-90° C. for 4 hours. After cooling to room temperature, this was extracted by the same procedure as in Example 1-1, and the solvent was distilled off to give 3.7 g of oligomer. 3.0 g of this oligomer was then used for condensation polymerization and further processing as in Example 1-1 to give 1.4 g of Polymer (14) ($\overline{MW}=85{,}000$).

Evaluation of Exposure Properties

EXAMPLE 1-15

0.9 g of the above Polymers (1)–(14) were dissolved in 5.1 g of MIBK, and filtered through a filter of pore size 0.2 μm so as to prepare a resist solution of 15 wt% concentration. The resist solution was spin-coated, onto a substrate consisting of a silicon wafer with a hard-baked 2 μm film of Microposit 2400 photoresist (Shipley). This was baked at 80° C. for 1 min on a hot plate so as to form a resist film of thickness specified in Table 2.

A desired test pattern was then written on the resist by an electron beam of accelerating voltage 20 KV. This pattern consisted of 10 sets of 1 μm lines and spaces. Several patterns were written by varying the radiation dosage. Each of 1 μm lines was scanned with 8 electron beams. The substrate was developed in MIBK for 1 min, rinsed with 2-propanol for 15 sec, and the remaining film thickness for each set evaluated with a Taly Step instrument. This value was divided by the original coating thickness to give the normalized remaining film thickness. The normalized values were plotted against the logarithm of the amount of radiation to give a characteristic curve. The sensitivity of this resist (the radiation dosage when the film thickness is 0.5 of its original value, $D_n^{0.5}$) on the organic film (Microposit 2400), as determined from the curve, and the slope of the tangent at this point which is the resist contrast $\gamma^{0.5}$, are also shown in Table 2.

Evaluation of $O_2$—RIE Resistance

EXAMPLE 1-16

Three specimens were prepared, i.e., a silicon wafer with a hard-baked, 2 μm film of Microposit 2400 photoresist, and two silicon wafers with films of Polymer (1) and Polymer (8) deposited to thicknesses of 0.42 μm and 0.47 μm respectively. The $O_2$—RIE resistance of these specimens was determined by a parallel plate dry etcher, operated at a power density of 0.08 W/cm², an etching chamber pressure of 1.5 Pa, and an $O_2$ gas flow rate of 20 sccm. When the 2 μm film of photoresist had almost been completely etched (this required about 25 min), the substrates were removed, and the remaining film thickness of each polymer layer was measured. It was found that there had been slight decreases of film thickness, i.e. 0.05 μm for Polymer (1) and 0.06 μm for Polymer (2), which may be considered to be substantially the same. The $O_2$—RIE resistance of the silicone resins prepared in this invention was, therefore, approximately constant regardless of the copolymer ratio, and was also about 30 times greater or more than that of the photoresists commonly used.

EXAMPLE 1-17 (Example of Bi-layer Resist)

On a silicon substrate with an SiO step pattern of height 1.1 μm, a hard-baked 2 μm film of Microposit 2400 photoresist was deposited for planarization, and on the latter film, a 0.3 μm film of polymer (1) was deposited. After writing various test patterns on this substrate with an irradiation of 3.5 μC/cm², they were developed in MIBK, and rinsed in 2-propanol to give a negative resist pattern. This substrate was then subjected to $O_2$—RIE for 42 min under the same conditions as in Example 1-16 to give a bi-layer resist pattern. The product was observed with a scanning electron microscope, which revealed 0.5 μm lines and spaces, 0.4 μm isolated lines, and 0.7 μm isolated spaces.

EXAMPLE 1-18

A bi-layer resist was formed by the method of Example 1-17, consisting of a bottom layer resist film of 1.0 μm thickness, and an upper layer resist film (Polymer (8)) of thickness 0.23 μm. The radiation intensity was 2.2 μC/cm², and $O_2$—RIE was carried out for 20 min. As a result, 0.4 μm lines and spaces, 0.3 μm isolated lines and 0.7 μm isolated spaces were found.

EXAMPLE 2-1

17.6 g (0.1 mol) of allyl trichlorosilane and 18.6 g (0.1 mol) of chloromethyltrichlorosilane were dissolved in a mixed solvent consisting of 186 ml methyl isobulyl ketone (also referred to as MIBK) and 64 ml tetrahydrofuran (also referred to as THF), and the solution was stirred while being cooled in ice.

To this solution, 22.9 ml triethylamine was added, followed by 31 ml water dripped in over a period of 15 min. While cooling in ice, stirring was continued for 3 hours, and the solution was heated under reflux for 2 hours.

This solution was cooled to room temperature, and the aqueous layer separated. The remaining organic layer was washed with water, an aqueous solution of $NaHCO_3$, water again and brine, and was then dried over $MgSO_4$ (magnesium sulfate). The organic layer was filtered, and the solvent was distilled off from the filtrate under reduced pressure to give a colorless, oily copolymer with a low degree of polymerization. The yield was 28.4 g.

4 g of the oily substance were taken, 0.4 ml of triethylamine were added and, after mixing thoroughly, the mixture was left for 30 min. This mixture solidified about 15 min after addition of the triethylamine. It was dissolved in a large amount of MIBK, then washed with water and brine. After drying over MgSO₄, the filtrate from the solution was evaporated under reduced pressure to give a colorless or pale yellow solid. This solid is the negative resist material of this invention, and consists of poly(silsesquioxane) represented by general formula (1) below:

$$CH_2=CHCH_2SiO_{3/2})_m(ClCH_2SiO_{3/2})_n \quad (1)$$

where m and n denote the molar fractions of each component of the polymer, and $m+N=100$.

In this example, m and n in formula (1) above are both 50. The weight average molecular weight of the poly(-silsesquioxane) in this Example was 8000. Other polymers were also synthesized in a similar manner to the procedure described in this Example, apart from the fact that the copolymerization ratio of starting materials was chosen such that m=66 or m=80 (see Table 3).

EXAMPLE 2-2 (EXPERIMENT OF SENSITIVITY TO ELECTRON BEAM)

The results of experiments carried out regarding the sensitivity of the negative resist material to an electron beam will be explained.

2 g of a copolymer synthesized as described above (m=50) was dissolved in 3 g of chlorobenzene, and the solution was filtered through a membrane filter of pore size 0.2 μm to give a resist solution.

The resist solution was then spin-coated onto several silicon substrates which had been prepared in advance, using a spinner rotation speed of 1500 rpm. The substrates were pre-baked at 100° C. on a hot plate for 1 min so as to give several sample wafers each with a resist film thickness of 0.4 μm. This thickness of resist film was taken as the initial thickness.

A 10 μm line pattern was then written on these sample wafers using a 20 KV electron beam, varying the dose for each sample.

The sample wafers which had been irradiated by the electron beam were developed in MIBK for 1 min, and rinsed with IPA (isopropyl alcohol) for 15 sec. A post-bake was then carried out on each wafer at 100° C. on a hot plate for 1 min.

The film thicknesses remaining on the resist patterns formed on the surfaces of the sample wafers treated as described above, were then measured by a Taly Step (commercial name of the film thickness measuring device manufactured by Taylor Hobson) in the case of each wafer.

A graph was constructed with remaining film thickness normalized by said initial thickness (fraction of film remaining) on the vertical axis, and dose on the horizontal axis (FIG. 2.). The characteristic curve I is the fraction of film remaining on each sample wafer, plotted against the dose received by each wafer. It was found that the electron beam radiation for a film fraction of 50%, i.e. the sensitivity $D_n^{0.5}$, was 1.4 μC/cm².

The resist therefore had a high sensitivity.

For copolymers with m=66 and m=80, resist solutions were prepared and their electron beam sensitivites were investigated in a similar way to the case of m=50. In FIG. 2, curve II shows the sensitivity characteristics of the resist with m=66, and curve III the characteristics of the resist with m=80.

The sensitivities of the resist with these copolymerization ratios were also found in a similar way to the case of m=50. The Table 3 shows the copolymerization ratios of all three types and their sensitivities $D_n^{0.5}$.

EXAMPLE 2-3 (METHOD OF FORMING RESIST PATTERN)

The following examples are those of the method of forming a bi-layer resist pattern described with reference to FIGS. 1A to 1C. In the following description, the numerals designating the corresponding layers are also reffered to. An explanation of the steps on the foundation (in this case, a silicon substrate) is omitted.

EXAMPLE 2-3a

Microposit 2400-33 (product name of a resist manufactured by Shipley) was first spin coated onto silicon substrates 11 using a rotation speed of 3000 rpm. The silicon substrates were then post-baked in an oven at 220° C. for 1 hour, so as to form lower layer resist 15. The film thickness of this lower resist 15 was 2 μm.

Next, a chlorobenzene solution of the resist material of this invention having a copolymerization ratio with m=50% (20% by weight), was coated onto this lower layer 15 using a rotation speed of 2000 rpm. This silicon substrate was pre-baked on a hot plate at 100° C. for 1 min so as to form an upper resist 17. The film thickness of the upper resist 17 was 0.26 μm.

Various line patterns were then written on upper resist 17, using a 20 KV electron beam at a dose of 1.6 μC/cm². This electron beam irradiated upper resist 17 was developed, rinsed and post-baked under similar conditions to those of Example 2-2 to give an upper resist pattern 17a. O₂—RIE was carried out on silicon substrate 11 for 25 min using a parallel plate dry etcher, operating conditions being an RF power density of 0.12 W/cm², O₂ gas pressure of 2.0 Pa and O₂ gas flowrate of 10 sccm. The exposed portion of lower resist 15 which is not covered by upper resist pattern 17a is removed to give a bi-layer resist pattern 19.

After etching, the bi-layer resist was examined by an SEM (Scanning Electron Microscope). It was found that a 0.6 μm line and space resist pattern of height 2.2 μm, and a 3 μm width line pattern of pitch 3.5 μm, had been well-formed.

It was also found that when O₂—RIE was carried out on the negative resist of this invention, the amount (initial etching amount) of etching that took place until the etching rate had effeetively dropped to zero, was 100–140 Å.

EXAMPLE 2-3b

A bi-layer resist pattern was formed in the same way as in Example 2-3a, excepting that the film thickness of Tower resist 15 was 3 μm, and O₂—RIE was carried out for 35 min. In this case, a 0.6 μm line and space resist pattern of height 3.2 μm was found to have been well-formed.

It should be noted that the Examples described herein are not exhaustive. The copolymerization ratio used in synthesizing the negative resist material of the invention, the film thicknesses used in forming resist patterns, and the accelerating voltages of the electron beams, may all be varied depending on the purpose.

It should also be noted that in the Examples above, similar results can be expected even if X-rays are used instead of electron beams. In this case, X-rays with the Pd-Lα characteristic are suitable.

As is clear from the above discription and the results of the examples, if silicone resins for resists are manufactured by the method of this invention, the disadvantage of gel formation in the polymerization is almost avoided, and a solvent-soluble silicone resin with a high degree of polymerization can be obtained in good yield. The silicone resins obtained have excellent properties for use as electron beam resists, i.e. they have good coatability, they gelate well when exposed to a low radiation dose with an electron beam, thereby rendering them insoluble in solvents, and they have excellent $O_2$—RIE resistance.

A resist pattern can be formed using the negative resist according to the invention, by an electron beam at a dose of 1.6 $\mu C/cm^2$ or less, and therefore the exposure time can be considerably shortened in comparison with conventional resists.

Its $O_2$—RIE resistance is about 50 times higher than that of ordinary resists such as Microposit 2400-33, and it is thus very suitable as the upper resist in a bi-layer resist process. A fine resist pattern can moreover be formed with an aspect ratio of 5 on a lower resist layer of about 3 $\mu m$ thickness.

This invention consequently offers negative resists with $O_2$—RIE resistance, and excellent sensitivity to electron beams and other high energy beams. It also permits the formation of fine patterns of high aspect ratio with a high throughput.

TABLE 1

| Example | m/n | Prepolymer Yield | Polymer Yield | MW | Polymer Number |
|---|---|---|---|---|---|
| 1-4 | 60/40 | 3.5 | 1.5 | 22.000 | (4) |
| 1-5 | 50/50 | 3.6 | 1.4 | 27.000 | (5) |
| 1-6 | 40/60 | 3.4 | 1.3 | 32.000 | (6) |
| 1-7 | 30/70 | 3.4 | 1.3 | 44.000 | (7) |
| 1-8 | 20/80 | 3.4 | 1.4 | 63.000 | (8) |
| 1-9 | 10/90 | 3.6 | 1.4 | 47.000 | (9) |
| 1-10 | 0/000 | 3.7 | 1.5 | 6.000 | (10) |

TABLE 3

| Copolymer Number | m:n | Sensitivity $D_n^{0.5}$ ($\mu C/cm^2$) |
|---|---|---|
| I | 50:50 | 1.4 |
| II | 66:34 | 1.3 |
| III | 80:20 | 1.0 |

TABLE 2

| Polymer Number | Film Thickness ($\mu m$) | Sensitivity $D_n^{0.5}$ ($\mu C/cm^2$) | $\gamma^{0.5}$ |
|---|---|---|---|
| 1 | 0.46 | 3.3 | 1.6 |
| 2 | 0.50 | 1.1 | 0.9 |
| 3 | 0.42 | 1.8 | 0.7 |
| 4 | 0.42 | 1.2 | 1.2 |
| 5 | 0.44 | 1.4 | 1.1 |
| 6 | 0.52 | 1.6 | 1.3 |
| 7 | 0.41 | 1.8 | 0.8 |
| 8 | 0.40 | 1.9 | 0.6 |
| 9 | 0.38 | 4.3 | 0.8 |
| 10 | 0.41 | 5.8 | 1.3 |
| 11 | 0.44 | 5.0 | 1.3 |
| 12 | 0.45 | 3.1 | 1.0 |
| 13 | 0.44 | 8.0 | 1.2 |
| 14 | 0.44 | 1.4 | 0.9 |

What is claimed is:

1. A negative resist material, consisting of poly(silsesquioxane) of weight average molecular weight 2000 or more represented by the general formula (1):

$$(CH_2=CHCH_2SiO_{3/2})_m(ClCH_2SiO_{3/2})_n \qquad (1)$$

where m and n denote the molar percentages of each component of the polymer, wherein both are positive numbers and $m+n=100$.

2. A material as set forth in claim 1 wherein the weight average molecular weight is 2500 or more.

3. A material as set forth in claim 2 wherein the weight average molecular weight is 3000 to 100,000.

4. A material as set forth in claim 1 wherein m is not more than 30.

5. A process for manufacturing a silicone resin used as resist material, wherein an oligomer is first obtained by hydrolyzing the trifunctional silane monomers represented by formulas (2) and (3) below for a time and temperature sufficient to produce said oligomer:

$$CH_2=CHCH_2SiX_3 \qquad (2)$$

$$ClCH_2SiY_3 \qquad (3)$$

X, Y being chlorine, bromine, methoxy, ethoxy or acetoxy that is susceptible to hydrolysis, said oligomer thus obtained is then further polymerized in the presence of an amine basic catalyst in an amount sufficient to further polymerize the oligomers to higher molecular weight polymers having a weight average molecular weight of 2000 or more, said catalytic polymerization reaction being carried out in ketonic solvent for a time and temperature sufficient to give a compound represented by formula (1) below:

$$(CH_2=CHCH_2SiO_{3/2})_{m'}(ClCH_2SiO_{3/2})_n \qquad (1)$$

m and n being molar percentages in which m and n are positive numbers and wherein $m+n=100$.

6. A process as set forth in claim 5, wherein the solvent in the polymerization is acetone, methyl isobutyl ketone, methyl ethyl ketone, dioxane or tetrahydrofuran.

7. A process as set forth in claim 5, wherein the basic catalyst used in the polymerization is triethylamine, tri-n-butylamine, pyridine, lutidine or —collidine.

8. A process as set forth in claim 5, wherein m is not more than 30.

9. A negative resist material according to claim 1 wherein m varies from 20 to 80 and n varies from 80 to 20.

10. A process according to claim 5 wherein m varies from 20 to 80 and n varies from 80 to 20.

11. A process according to claim 5 wherein the hydrolysis is carried out in the presence of an acid.

12. A process according to claim 5 wherein the hydrolysis is carried out in the presence of triethylamine.

* * * * *